US012230607B2

(12) United States Patent
Chang et al.

(10) Patent No.: US 12,230,607 B2
(45) Date of Patent: Feb. 18, 2025

(54) SEMICONDUCTOR DEVICE INCLUDING POWER MANAGEMENT DIE IN A STACK AND METHODS OF FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 683 days.

(21) Appl. No.: 17/477,620

(22) Filed: Sep. 17, 2021

(65) Prior Publication Data

US 2022/0320045 A1 Oct. 6, 2022

Related U.S. Application Data

(60) Provisional application No. 63/168,363, filed on Mar. 31, 2021.

(51) Int. Cl.
*H01L 25/065* (2023.01)
*G06F 1/3203* (2019.01)
*H01L 23/538* (2006.01)

(52) U.S. Cl.
CPC ........ *H01L 25/0657* (2013.01); *G06F 1/3203* (2013.01); *H01L 23/5384* (2013.01); *H01L 23/5385* (2013.01); *H01L 23/5386* (2013.01)

(58) Field of Classification Search
CPC  G06F 1/3203; H01L 23/5384; H01L 25/0657
See application file for complete search history.

(56) References Cited

U.S. PATENT DOCUMENTS

| | | | |
|---|---|---|---|
| 8,547,769 B2 * | 10/2013 | Saraswat ............ | H01L 25/0657 365/189.09 |
| 8,897,053 B1 * | 11/2014 | Stephens, Jr. ........... | G11C 5/02 365/194 |
| 9,449,653 B2 * | 9/2016 | Kim ...................... | G11C 5/063 |
| 10,079,489 B2 * | 9/2018 | Droege ................... | G11C 7/00 |
| 10,332,829 B2 * | 6/2019 | Hong .................. | H01L 23/5286 |
| 10,504,824 B1 * | 12/2019 | Pan ....................... | H01L 21/304 |
| 10,748,874 B2 * | 8/2020 | Brewer ............... | H01L 27/0688 |
| 11,435,397 B2 * | 9/2022 | Choi .............. | G01R 31/318511 |
| 2010/0052111 A1 * | 3/2010 | Urakawa ................. | H01L 25/18 257/621 |
| 2011/0109382 A1 * | 5/2011 | Jin ......................... | G11C 5/063 257/621 |
| 2013/0335059 A1 * | 12/2013 | Saraswat ............... | H01L 23/481 323/355 |

(Continued)

*Primary Examiner* — Eugene Lee
(74) *Attorney, Agent, or Firm* — The Marbury Law Group, PLLC

(57) ABSTRACT

A semiconductor device includes a first semiconductor die that operates at a first power, a second semiconductor die that is formed in a stack on the first semiconductor die and operates at a second power different than the first power, and a power management semiconductor die that is formed in the stack and provides the first power to the first semiconductor die through a first via and provides the second power to the second semiconductor die through a second via.

20 Claims, 14 Drawing Sheets

(56) References Cited

U.S. PATENT DOCUMENTS

| | | | |
|---|---|---|---|
| 2015/0137229 A1* | 5/2015 | Sulistyanto | H01L 29/42368 |
| | | | 438/286 |
| 2015/0168972 A1* | 6/2015 | Mathiyalagan | H01L 23/50 |
| | | | 327/540 |
| 2016/0351553 A1* | 12/2016 | Du | H01L 25/18 |
| 2018/0012867 A1* | 1/2018 | Kim | H01L 25/18 |
| 2018/0095127 A1* | 4/2018 | Pappu | H03K 19/1776 |
| 2018/0122779 A1* | 5/2018 | Vogt | H10B 12/00 |
| 2018/0137005 A1* | 5/2018 | Wu | G11C 7/10 |
| 2019/0096503 A1* | 3/2019 | Chakravarty | H01L 23/5384 |
| 2020/0006164 A1* | 1/2020 | Yu | H01L 25/0657 |
| 2020/0006194 A1* | 1/2020 | Huang | H01L 25/50 |
| 2020/0020670 A1* | 1/2020 | Koyanagi | H01L 23/481 |
| 2020/0168527 A1* | 5/2020 | Chang | H01L 24/17 |
| 2020/0320243 A1* | 10/2020 | Hwang | H01L 25/0657 |
| 2021/0193623 A1* | 6/2021 | Oh | G11C 29/025 |
| 2022/0165707 A1* | 5/2022 | Song | H01L 25/105 |
| 2022/0253119 A1* | 8/2022 | Baskaran | G06F 1/3243 |

\* cited by examiner

SEMICONDUCTOR DEVICE INCLUDING POWER MANAGEMENT DIE IN A STACK AND METHODS OF FORMING THE SAME

RELATED APPLICATIONS

This application claims priority to U.S. Provisional Patent Application No. 63/168,363 entitled "SoIC embedded power distribution system" filed on Mar. 31, 2021, the entire contents of which are hereby incorporated by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller semiconductor packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices.

Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
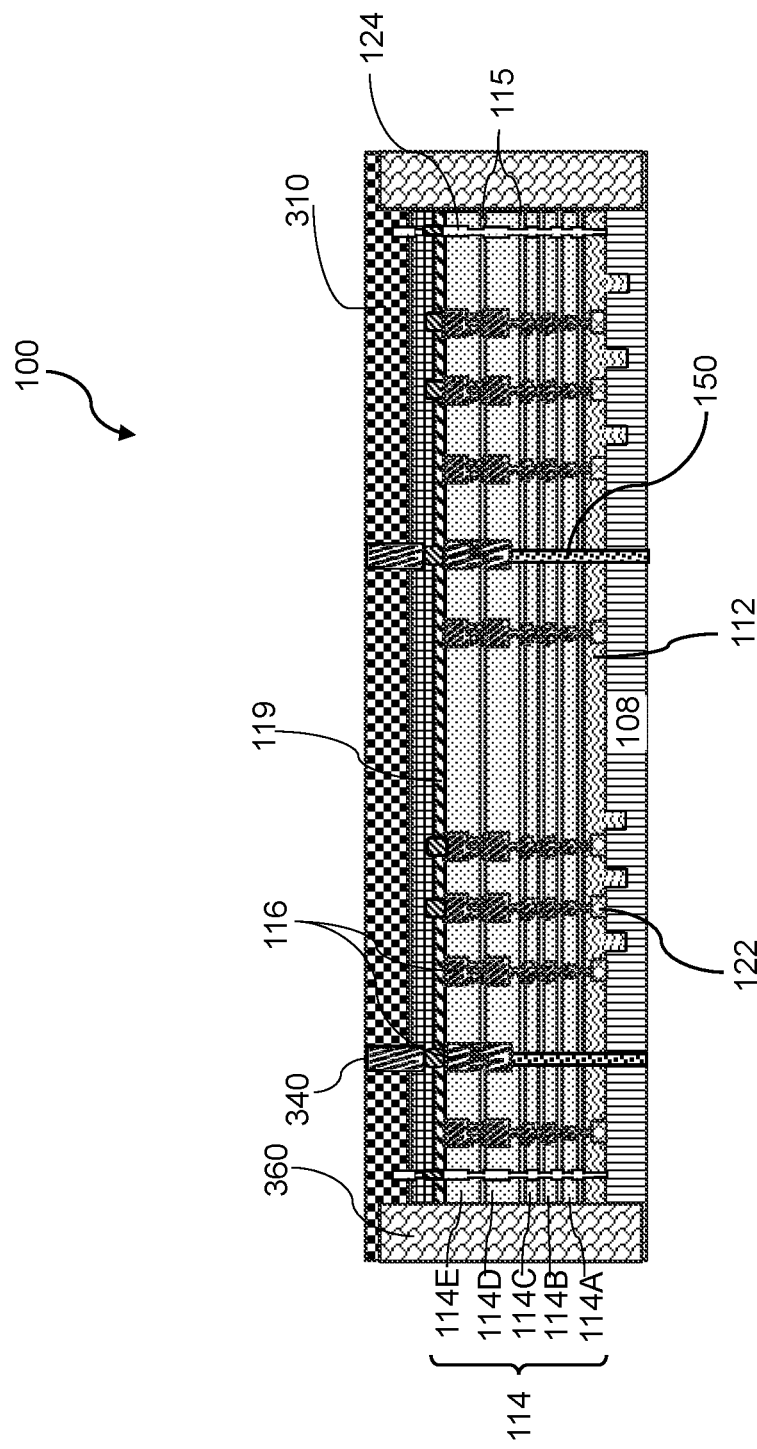
FIG. 1 illustrates a vertical cross-section view of a semiconductor die 100, according to one or more embodiments of the present invention.

The following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor die may contain one or more integrated circuits such as relating to at least one of memory, processor(s), or other semiconductor component(s). A plurality of such dies may be formed on a wafer and then diced out (i.e., singulated) and removed from the wafer. According to one or more embodiments, the wafer, and thus one or more of the semiconductor dies removed therefrom, may include at least one of silicon, germanium, silicon on insulator (SOI), or one or more epitaxial layers.

The semiconductor dies may be cut from the wafer by a saw, such as a diamond saw. A die attach film (DAF) may serve to maintain a relative position between the semiconductor dies during the dicing and removal process. The saw cuts along scribe lines on the wafer to remove the semiconductor dies from the wafer and to separate the semiconductor dies from one another.

Known good dies may be placed upon a carrier such as a glass substrate or other material. Semiconductor dies that meet one or more quality metrics, and are therefore referred to as known good dies, are placed on the carrier. By placing known good dies on the carrier, a decrease in yield may be mitigated because semiconductor arrangements that are formed on the known good dies are less likely to perform other than desired due to being formed on defective semiconductor dies.

An amount of space or distance between respective semiconductor dies may be increased when the semiconductor dies are placed on the carrier as compared to when the semiconductor dies are initially formed on the wafer. The additional space between semiconductor dies may be a function of known good dies being placed on the carrier, such that not all semiconductor dies from the wafer may be transferred to the carrier. The additional space between semiconductor dies provides a larger footprint for making electrical connections to the semiconductor dies thereby affording fan-out packaging.

The known good dies may be embedded in a material, such as a molding compound, on the carrier. The molding compound may be formed over and around the semiconductor dies. A top portion of the molding compound may be removed to expose a top surface of the semiconductor dies. Conductive pads, at times referred to as interconnects, may be exposed when the molding compound is removed to expose the top surface of the semiconductor dies. The additional area between the semiconductor dies may allow an increased number of input/output (I/O) signal wires to fan out from interconnects of the semiconductor dies. The increased number of I/O signal wires may afford, among other things, an increased pin count per semiconductor die, thus allowing more electrical connections, functionality, etc. to be realized from each semiconductor die. The additional area between semiconductor dies may allow passive devices, such as inductors and capacitors, to be formed over the molding compound between semiconductor dies, which may result in lower substrate signal loss, where substrate signal loss can occur when passive devices are formed closer to a semiconductor substrate or closer to other components formed on the substrate.

A plurality of the semiconductor dies may be included in a semiconductor device such as a system on integrated chip (SoIC) device, a chip on wafer on substrate (CoWoS) device and a chip on wafer (CoW) device.

In one or more embodiments of the present invention, a system on integrated chips (SoIC) device may include a multi-die stack having a plurality of different dies with different die functions. In addition, each of the plurality of dies may have different power requirements (e.g., voltage requirements, current requirements, etc.) from the other dies included in the multi-die stack. Various embodiments disclosed herein may provide for a power distribution system that may be embedded in the SoIC device. The embedded power distribution system may be used to manage power in the SoIC device so as to achieve power savings.

In order to achieve power savings, the SoIC device may include a power management semiconductor die that transmits the appropriate voltage to each die in the multi-die stack through a through substrate via (TSV). The power management semiconductor die may include a core area that is smaller than the power management function area of the die, and/or the core area that is smaller than the I/O area of the die.

The power management semiconductor die may include, for example, a power management integrated circuit (PMIC) die configured such that a bipolar-CMOS (complementary metal oxide semiconductor)-DMOS (double diffused metal oxide semiconductor) area (e.g., BCD area) of the PMIC die may be greater than an area of a core of the PMIC die. The power management semiconductor die may include, for example, a high voltage (HV) die configured such that a high voltage area of the HV die is greater than the core of the HV die, and such that an input/output (I/O) area of the HV die is greater than the core of the HV die.

The power management semiconductor die may have features similar to the features of a substation in a smart grid system. In particular, similar to a substation, the power management semiconductor die may enable bi-directional communication between the power management semiconductor die and each semiconductor die that is included in the SoIC device. The power management semiconductor die may provide a demand response capacity to help balance electrical consumption with supply, and reduce costs, increase reliability, and enhance electric power efficiency.

The power management semiconductor die may include a plurality of different MOSFETs (e.g., standard silicon FET, high-k plus metal gate FET, etc.) in order to supply a plurality of different voltages. In particular, the MOSFETs of the power management semiconductor die may include a plurality of different gate materials (e.g., metal, polysilicon) and gate thicknesses, and/or a plurality of different gate insulation materials (e.g., silicon dioxide, high-k material) and gate insulation thicknesses. The power management semiconductor die may also include a voltage rise and fall function, and an optional metal-insulator-metal (MIM) capacitor structure.

The power management semiconductor die may be provided on any layer of the SoIC device. For example, the power management semiconductor die may be located in the middle of a plurality of stacked wafers. From such a location, the power management semiconductor die may supply power to a die stacked above the power management semiconductor die and/or to a die stacked below the power management semiconductor die. The power management semiconductor die may include a die adjustment function, so that the power management semiconductor die may adjust a power supplied to the dies in the SoIC device having one or more of an adjusted voltage, current, power and frequency.

In order to achieve power savings, the SoIC device may include a SiC-based device or a GaN-based device. SiC (Silicon Carbide) has a band gap of 2.86 eV and GaN (Gallium nitride) has a band gap of 3.4 eV, whereas Si (Silicon) has a band gap of only 1.2 eV. Thus, both GaN-based devices and SiC-based devices may have higher electron mobility than Si devices, and therefore, may be able to provide power savings in the SoIC device.

Referring to the drawings, FIG. 1 illustrates a semiconductor die 100 that may be included in a semiconductor device that comprises a multi-die stack according to one or more embodiments. The semiconductor die 100 may include a semiconductor substrate (e.g., silicon substrate) 108. An interlayer dielectric (ILD) 112 may be formed on the semiconductor substrate 108 and an intermetal dielectric (IMD) 114 may be formed over the ILD 112. The ILD 112 and IMD 114 may include, for example, undoped silicon glass (USG), fluorosilicate glass (FSG), etc. The IMD 114 may include a plurality of IMD layers 114A-114E, which are separated by various etch stop and seal layers 115. The etch stop and seal layers 115 may include, for example, SiC, SiN, etc.

Metal features 116 may be formed in the IMD 114. The metal features 116 may include, for example, various conductive metal vias that may be formed between and in contact with various conductive metal lines. The metal features 116 may be formed of copper, copper alloys, aluminum, aluminum alloys, or some combination thereof. Other suitable conductive metal materials may be used for the metal features 116 are within the contemplated scope of disclosure. The upper surfaces of the uppermost IMD layer 114E and the metal features 116 may be planarized to be coplanar, and a passivation layer 119 may be formed on the planarized surfaces of the uppermost IMD layer 114E and the metal features 116. The passivation layer 119 may include, for example, silicon oxide (e.g., $Si_xO_y$), silicon nitride ($Si_xN_y$), benzocyclobutene (BCB) polymer, polyimide (PI), polybenzoxazole (PBO) or a combination thereof, and may be formed by a suitable process such as spin coating, CVD or the like.

One or more gate electrodes 122 of one or more semiconductor transistor devices may be formed on the semiconductor substrate 108. The metal features 116 may be electrically connected to the gate electrodes 122. One or more seal rings 124 may also be formed in the IMD 114. The seal rings 124 may be formed so as to encircle a functional circuit region of the semiconductor die 100. The seal rings 124 may be electrically isolated from the metal features 116 and may provide protection for the features of semiconductor die 100 from water, chemicals, residue, and/or contaminants that may be present during the processing of the semiconductor die 100. The seal rings 124 may be formed of a conductive material (e.g., metal material) and more particularly, may be formed of the same material, at the same time, and by the same process as the metal features 116. In other embodiments, the seal rings 124 may be formed of a conductive material that is different than the materials forming the metal features 116.

The semiconductor die 100 may also include one or more conductive through-substrate vias (TSV) 150 that may be connected to one or more of the metal features 116. The conductive TSV 150 may extend from the metal feature 116 through the IMD 114, ILD 112, and semiconductor substrate 108. The conductive TSV 150 may include, for example, copper, gold, silver, aluminum or an alloy of two or more of these metals, such as an aluminum copper (AlCu) alloy. Other conductive metal materials for use as the TSV 150 may be within the contemplated scope of disclosure.

The semiconductor die 100 may be attached, for example, to a substrate (not shown). The substrate may include a semiconductor wafer or a carrier substrate and may include, for example, silicon-based materials such as glass, silicon oxide, aluminum oxide, ceramic materials, or combinations thereof. The substrate may include a planar top surface on which the semiconductor substrate 108 of the semiconductor die 100 can be attached.

A dielectric encapsulation layer 360 may be formed on the semiconductor die 100 so as to encapsulate at least a portion of the semiconductor die 100. The dielectric encapsulation layer 360 may include, for example, silicon dioxide. Alternatively, the dielectric encapsulation layer 360 may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). Other dielectric materials for use as the dielectric encapsulation layer 360 are within the contemplated scope of disclosure.

The semiconductor die 100 may be included, for example, as a part of a semiconductor die stack. For example, a bonding structure 310 may be formed on the semiconductor die 100 and used to bond the semiconductor die 100 to another semiconductor die in the semiconductor die stack. The material and formation method of the bonding structure 310 may be similar to those of the ILD 112. A conductive via 340 may be formed in the bonding structure 310 and contact (e.g., directly or indirectly) a metal feature 116 in the semiconductor die 100. The conductive via 340 may be formed of the same material as the metal features 116 and/or the conductive TSV 150. In other embodiments, the conductive via 340 may be formed of a different conductive material than the metal features 116 and/or TSV 150.

Figure 2:
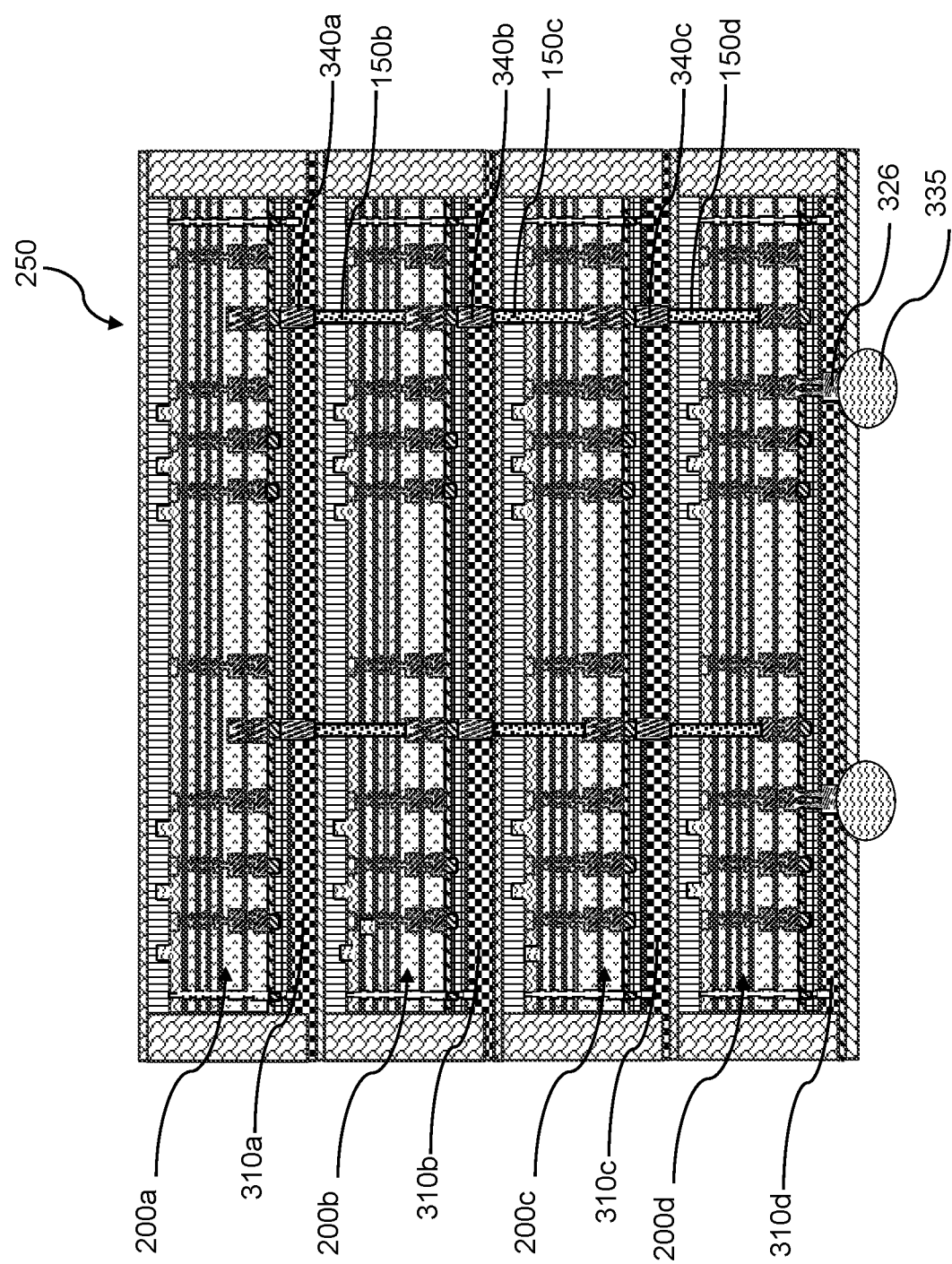
FIG. 2 illustrates a vertical cross-section view of a semiconductor die stack 250 (e.g., vertical semiconductor die stack) according to one or more embodiments.

FIG. 2 illustrates a semiconductor die stack 250 (e.g., vertical semiconductor die stack) according to one or more embodiments. The semiconductor die stack 250 includes a plurality of stacked semiconductor dies 200a-200d. The semiconductor dies 200a-200d illustrated in FIG. 2 may flipped or inverted (e.g., the semiconductor substrate is on top) as compared to the semiconductor die 100 illustrated in FIG. 1. The features and materials of the semiconductor dies 200a-200d may be similar to the features and materials of the semiconductor die 100 as described above.

In particular, the semiconductor die stack 250 may be a horizontal SoIC multi-die stack that may include different dies having different functions. Each die may have a different voltage requirement. Power management may be needed in the semiconductor die stack 250 to achieve efficient power usage and savings.

The semiconductor die stack 250 may be formed, for example, by stacking semiconductor die 200b on semiconductor die 200a so that the conductive TSV 150b in semiconductor die 200b contacts the conductive via 340a in bonding structure 310a, and bonding the semiconductor die 200b to the bonding structure 310a, then stacking semiconductor die 200c on semiconductor die 200b so that the conductive TSV 150c in semiconductor die 200c contacts the conductive via 340b in bonding structure 310b, and bonding the semiconductor die 200c to the bonding structure 310b, then stacking semiconductor die 200d on semiconductor die 200c so that the conductive TSV 150d in semiconductor die 200d contacts the conductive via 340c in bonding structure 310c, and bonding the semiconductor die 200d to the bonding structure 310c. Metal bumps 335 may be connected to the metal pads 326 in the bonding structure 310d to complete the semiconductor die stack 250.

Figure 3:
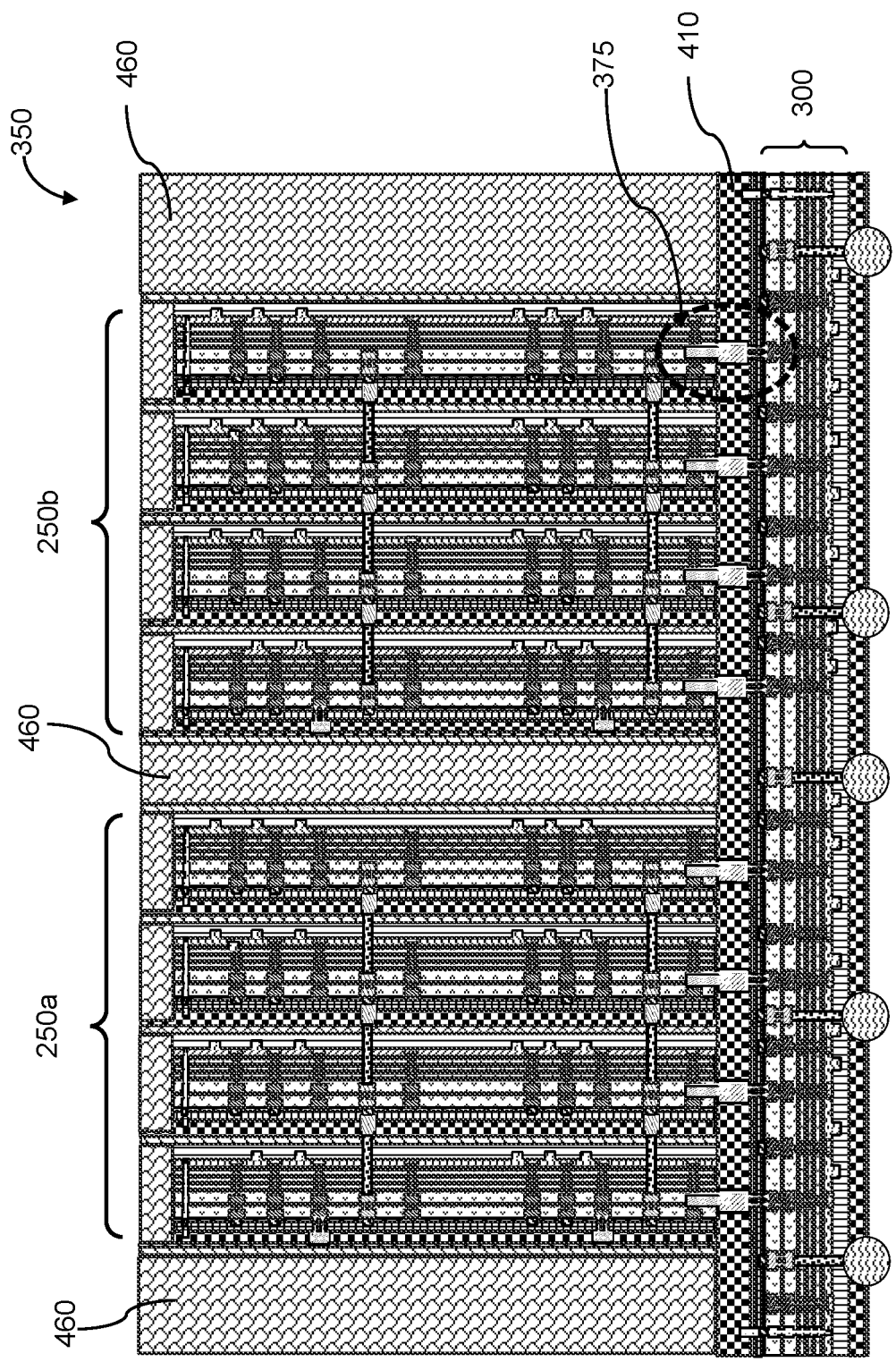
FIG. 3 illustrates a vertical cross-section view of a semiconductor die stack 350 (e.g., vertical semiconductor die stack) according to one or more embodiments.

FIG. 3 illustrates a semiconductor die stack 350 (e.g., vertical semiconductor die stack) according to one or more embodiments. The semiconductor die stack 350 includes a plurality of semiconductor die stacks 250a, 250b which may be similar in structure and function to the semiconductor die stack 250 in FIG. 2. The semiconductor die stacks 250a, 250b may be encapsulated together by a dielectric encapsulation layer 460 which may be similar to the dielectric encapsulation layer 360 in FIG. 1.

The semiconductor die stacks 250a, 250b may be mounted (e.g., vertically mounted as a unit) on a base semiconductor die 300 (e.g., bottom semiconductor die) which may be similar in structure and function to the semiconductor die 100 described above. That is, the semiconductor die stacks 250a, 250b may be mounted on the base semiconductor die 300 so that a side face of the plurality of semiconductor die stacks 250a, 250b are bonded to an upper surface of the base semiconductor die 300. The semiconductor die stack 350 may also include a bonding structure 410 formed on the base semiconductor die 300, and one or more junction circuits 375 formed in the bonding structure 410 and electrically connecting the base semiconductor die 300 to the plurality of semiconductor die stacks 250a, 250b. In particular, each of the semiconductor dies of the semiconductor die stacks 250a, 250b may be connected to the base semiconductor die 300 by a dedicated junction circuit 375, as illustrated in FIG. 3.

In particular, the semiconductor die stack 350 may be a vertical SoIC multi-die stack that may include different dies having different functions. Each die may have a different voltage requirement. Power management may be needed in the semiconductor die stack 350 to achieve efficient power usage and savings.

Figure 4A:
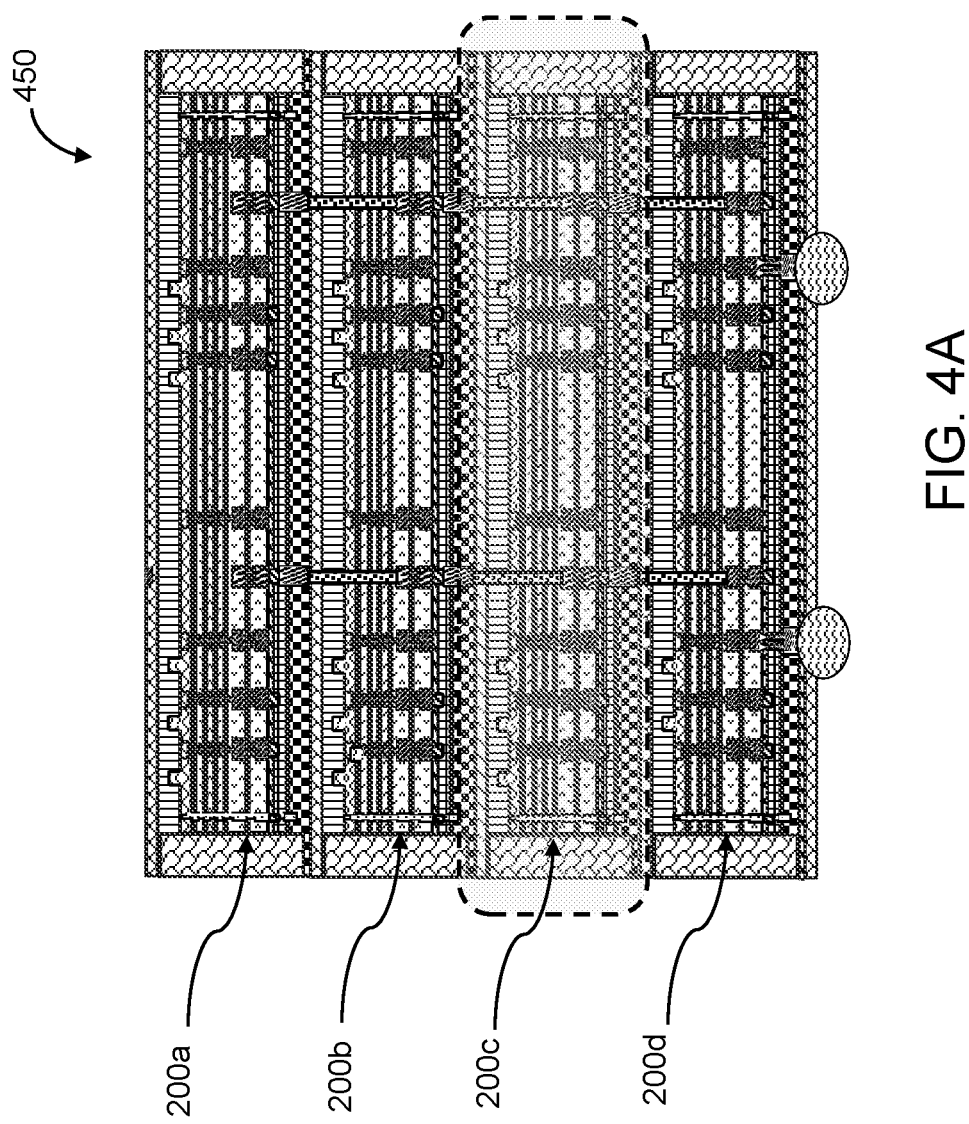
FIG. 4A illustrates a vertical cross-section view of a semiconductor die stack 450 according to one or more embodiments.

FIG. 4A illustrates a semiconductor die stack 450 (e.g., vertical semiconductor die stack) according to one or more embodiments. The semiconductor die stack 450 may have a similar structure as the semiconductor die stack 250 and be formed by a method of fabrication that is similar to the method of fabricating the semiconductor die stack 250.

The semiconductor die stack 450 may be an SoIC device. The semiconductor die stack 450 may include semiconductor die 200c. Semiconductor die 200c may be a power management semiconductor die for managing power in the semiconductor die stack 450. The power management semiconductor die (e.g., semiconductor die 200c) may transmit the appropriate voltage to other semiconductor dies (200a, 200b, 200d) by using a through substrate via (TSV). The power management semiconductor die may include a core area that is smaller than the power management function area of the power management semiconductor die, and/or smaller than an input/output (I/O) area of the power management semiconductor die.

The power management semiconductor die may have features similar to the features of a substation in a smart grid system. In particular, similar to a substation in a smart grid system, the power management semiconductor die (e.g., semiconductor die 200c) may enable bi-directional communication between the power management semiconductor die and the other semiconductor dies (200a, 200b, 200d) in the SoIC device. The power management semiconductor die may provide a demand response capacity to help balance electrical consumption with supply, and reduce costs, increase reliability, and enhance electric power efficiency.

The power management semiconductor die (e.g., semiconductor die 200c) may utilize a plurality of different MOSFETs (e.g., standard silicon FET, high-k plus metal gate FET, etc.) in order to supply a plurality of different voltages. In particular, the MOSFETs of the power management semiconductor die may include a plurality of different gate materials (e.g., metal, polysilicon) and gate thicknesses, and/or a plurality of different gate insulation materials (e.g., silicon dioxide, high-k material) and gate insulation thicknesses. The power management semiconductor die may also include a voltage rise and fall function, and an optional metal-insulator-metal (MIM) capacitor structure.

The power management semiconductor die (e.g., semiconductor die 200c) may be provided on any layer of the semiconductor die stack 450. For example, the power management semiconductor die maybe in the middle of the stacked dies and supply power to a semiconductor die above it and/or a semiconductor die below it. The power management semiconductor die may include a die adjustment function, so that it may adjust a power supplied to the semiconductor dies in the semiconductor die stack 450 having one or more of an adjusted voltage, current, power and frequency. In order to achieve power savings, the semiconductor die stack 450 may include a SiC-based device or a GaN-based device.

Providing power from the power management semiconductor die 200c may work to achieve power savings. Generally, an operating voltage of an I/O and core of chips (e.g., operating voltage of the I/O and core of semiconductor die 200a, semiconductor die 200b, or semiconductor die 200d) may be different. A voltage conversion may be necessary to provide the different operating voltages, and such voltage conversion may typically be performed by an internal transistor of the chips. Various embodiments described herein may perform the voltage conversion by the power management semiconductor die 200c (e.g., the power management chip) which may be more efficient at voltage conversion than the chips. Indeed, the power management semiconductor die 200c may be designed and fabricated with design structures for the purpose of providing better conversion efficiency, and may not be limited to other stacked single chip manufacturing processes. Thus, power savings can may achieved by performing voltage conversion in the power management semiconductor die 200c with high conversion efficiency, and then transmitting the different voltages to a required operating area of the chips.

Figure 4B:
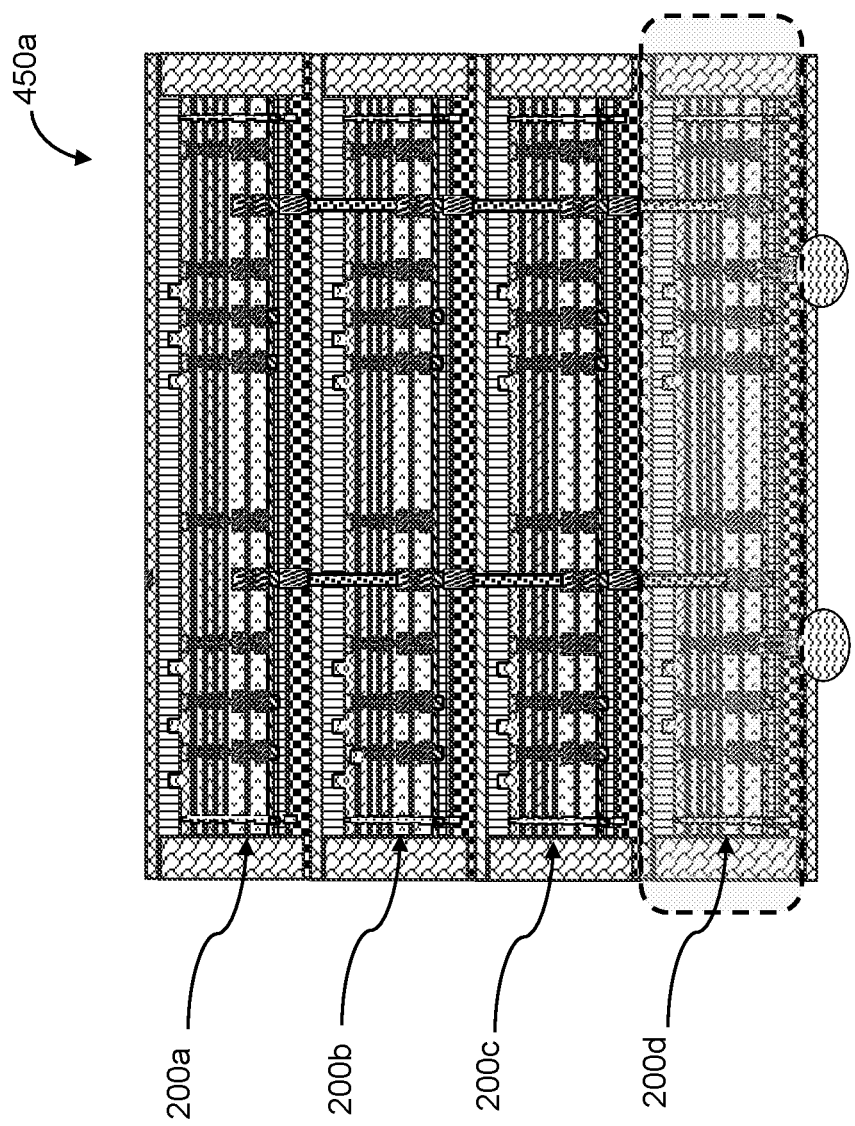
FIG. 4B illustrates a vertical cross-section view of a semiconductor die stack 450a according to one or more embodiments.

FIG. 4B illustrates a semiconductor die stack 450a (e.g., vertical semiconductor die stack) according to one or more embodiments. The semiconductor die stack 450a may have a similar structure as the semiconductor die stack 450, but in the semiconductor die stack 450a, the semiconductor die 200d (not semiconductor die 200c) may be a power management semiconductor die for managing power in the semiconductor die stack 450. Thus, a point of FIG. 4B is to show that any of the semiconductor dies 200a-200d may be a power management semiconductor die in some embodiments of the invention.

Providing power from the power management semiconductor die 200d may work to achieve power savings. Generally, an operating voltage of an I/O and core of chips (e.g., operating voltage of the I/O and core of semiconductor die 200a, semiconductor die 200b or semiconductor die 200c) may be different. A voltage conversion may be necessary to provide the different operating voltages, and such voltage conversion may typically be performed by an internal transistor of the chips. In the present invention, however, the voltage conversion may be performed by the power management semiconductor die 200d (e.g., the power management chip) which may be more efficient at voltage conversion than the chips. Indeed, the power management semiconductor die 200d may be designed and fabricated with design structures for the purpose of providing better conversion efficiency, and may not be limited to other stacked single chip manufacturing processes. Thus, power savings can be achieved by performing voltage conversion in the power management semiconductor die 200d with high conversion efficiency, and then transmitting the different voltages to a required operating area of the chips.

Figure 5A:
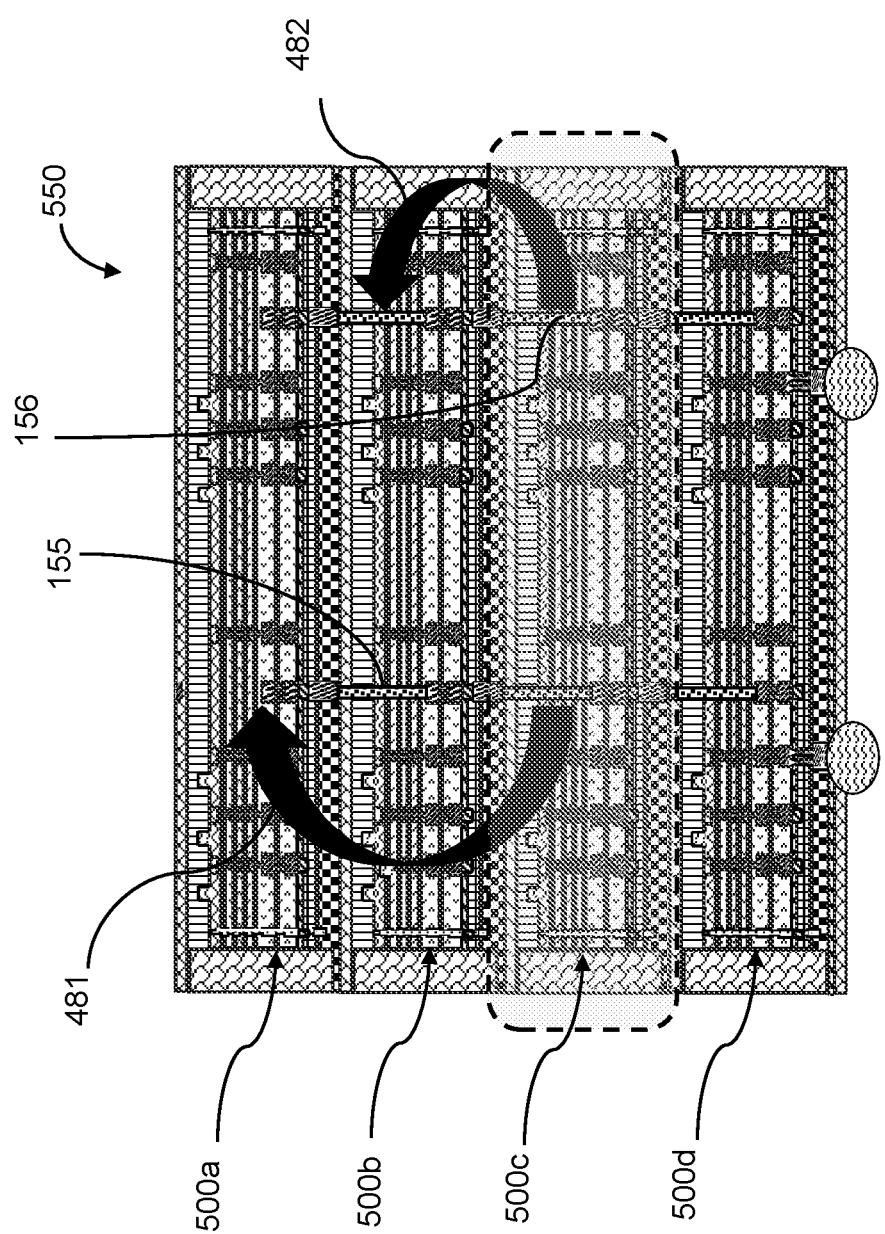
FIG. 5A illustrates a vertical cross-section view of a semiconductor die stack 550 according to one or more embodiments.

FIG. 5A illustrates a semiconductor die stack 550 (e.g., vertical semiconductor die stack) according to one or more embodiments. The semiconductor die stack 550 includes a plurality of semiconductor dies 500a, 500b and 500d, and a power management integrated circuit (PMIC) die 500c that manages power in the semiconductor die stack 550. The PMIC die 500c may perform various functions related to power requirements in the semiconductor die stack 550. The PMIC die 500c may, for example may have a function of AC to DC conversion, battery management, power-source selection, voltage regulation, dynamic voltage scaling, dynamic frequency scaling and/or power sequencing. The PMIC die 500c may control the flow and direction of electrical power in the semiconductor die stack 550. The semiconductor die stack 550 may have multiple internal voltages (e.g., 5 V, 3.3 V, 1.8 V, etc.) and sources of external power (e.g., wall outlet, battery, etc.), meaning that the power design of the semiconductor die stack 550 may have multiple power requirements for operation, and the PMIC die 500c may be configured so as to accommodate all of the multiple power requirements.

In particular, the PMIC die 500c may provide a first power 481 to semiconductor die 500a by a via (e.g., through silicon via (TSV)) 155 and may provide a second power 482 which is different than the first power 481 to semiconductor die 500b by a via (e.g., TSV) 156. The first power 481 and second power 482 may be different, for example, in terms of voltage, current, frequency, etc. Thus, for example, the first power 481 may include a first voltage (e.g., high voltage) and the second power 482 may include a second voltage (e.g., low voltage) different (e.g., less than) than the first voltage. The first power 481 may include a first current and the second power 482 may include a second current different (e.g., less than) than the first current, and so on.

Further, there may be a plurality of TSVs 155 and a plurality of TSVs 156 in the semiconductor die stack 550 that are used by the PMIC die 500c to provide power to the various semiconductor dies 200a, 200b, 200d in the semiconductor die stack 550. The plurality of TSVs may have a different structure and/or made of a different material depending upon the type of power that is to be supplied. For example, a TSV 155 that is to provide power with a high voltage may have a greater cross-sectional area (e.g., axial diameter) than a TSV 156 that is to provide power with a low voltage.

Providing power from the PMIC die 500c by way of TSV 155 and TSV 156 may work to achieve power savings. Generally, an operating voltage of an I/O and core of chips (e.g., operating voltage of the I/O and core of semiconductor die 500a or semiconductor die 500b) may be different. A voltage conversion may be necessary to provide the different operating voltages, and such voltage conversion may typically be performed by an internal transistor of the chips. In the present invention, however, the voltage conversion may be performed by the PMIC die 500c (e.g., the power management chip) which may be more efficient at voltage conversion than the chips. Indeed, the PMIC die 500c can be designed and fabricated with design structures for the purpose of providing better conversion efficiency, and may not be limited to other stacked single chip manufacturing processes. Thus, power savings can be achieved by performing voltage conversion in the PMIC die 500c with high conversion efficiency, and then transmitting the different voltages to a required operating area of the chips by way of the TSV 155 and TSV 156.

Figure 5B:
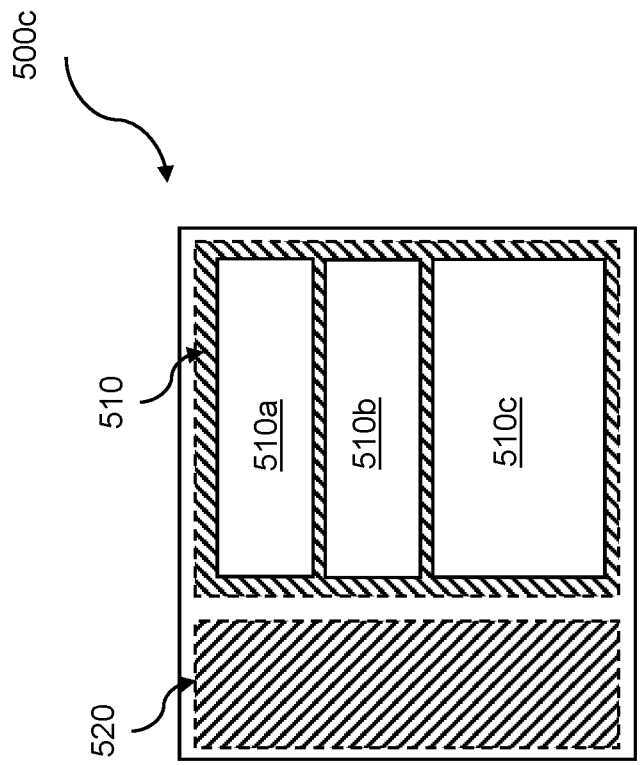
FIG. 5B illustrates a plan view of the PMIC die 500c (e.g., a layout design of the PMIC die 500c) according to some embodiments.

FIG. 5B illustrates a plan view of the PMIC die 500c (e.g., a layout design of the PMIC die 500c) according to some embodiments. As illustrated in FIG. 5B, the PMIC die 500c includes a power management function area 510 in which elements for managing power in the stacked semiconductor device 550 are located, and a core area 520 in which processing elements are located. The PMIC die 500c (e.g., power management chip) may be designed to have a main function of providing other chips with appropriate current, voltage, and power, and thus, a core of the PMIC die 500c may occupy a relatively small area. In particular, in the PMIC die 500c, the core area 520 may have a size that is less than a size of the power management function area 510. In some embodiments, a size of the power management function area 510 may be more than twice the size of the core area 520.

The power management function area 510 may include, for example, a bipolar-CMOS (complementary metal oxide semiconductor)-DMOS (double diffused metal oxide semiconductor) area or BCD area. Thus, in the PMIC die 500c, the BCD area (e.g., power management function area 510) may be greater than the core area 520 and, in particular, may be more than twice the size of the core area 520. The BCD area may include, for example, a bipolar section 510a that may include an analog block, a CMOS section 510b that may include a digital controller, and a DMOS section 510c that may include a power stage. An operating voltage of the BCD area (e.g., greater than 1.2V) may be greater than an operating voltage (e.g., about 1.1V-1.2V) of the core area 520.

Figure 6A:
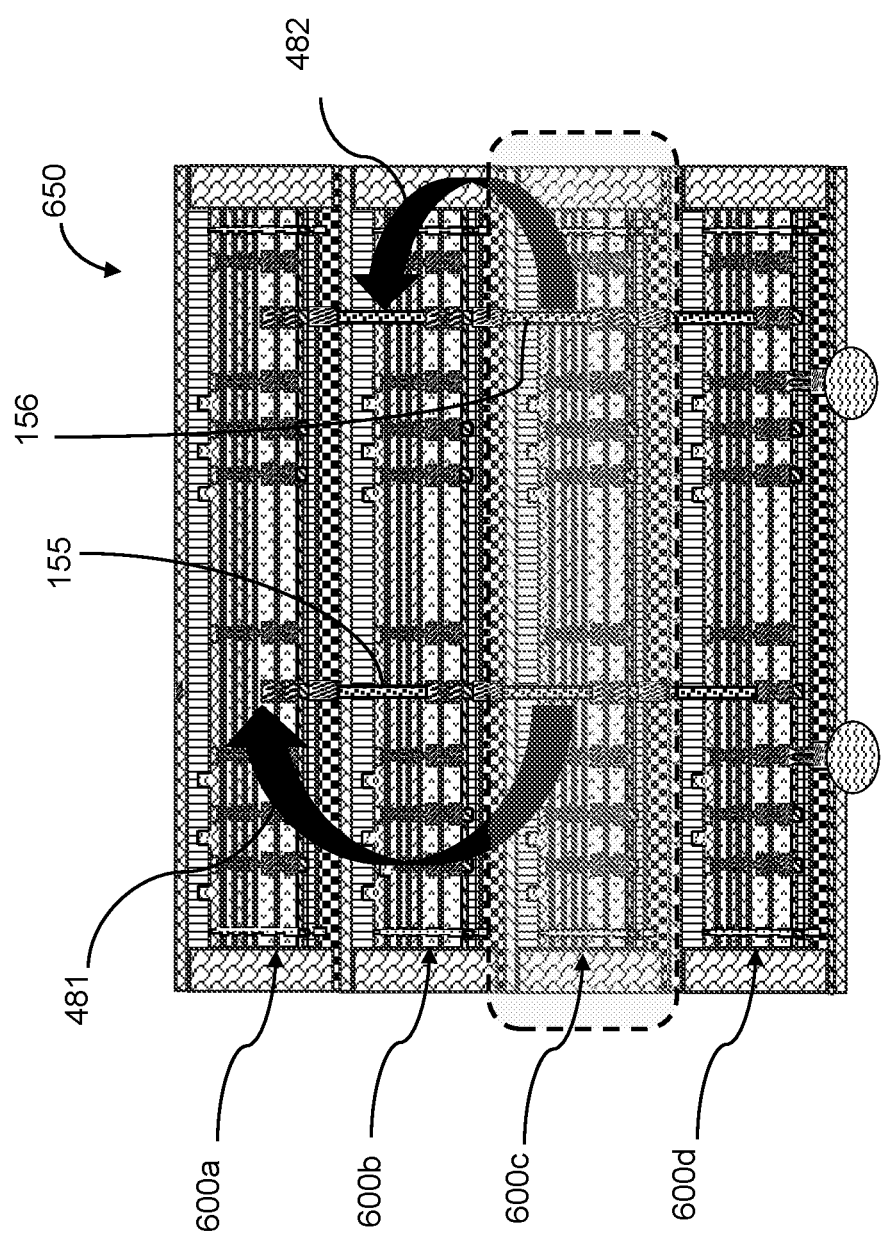
FIG. 6A illustrates a vertical cross-section view of a semiconductor die stack 650 according to one or more embodiments.

FIG. 6A illustrates a semiconductor die stack 650 (e.g., vertical semiconductor die stack) according to one or more embodiments. The semiconductor die stack 650 includes a plurality of semiconductor dies 600a, 600b and 600d, and a high voltage (HV) die 600c that supplies power to the semiconductor dies 600a, 600b and 600d in the semiconductor die stack 650.

The HV die 600c may provide a first power 481 to semiconductor die 600a by a via (e.g., through silicon via (TSV)) 155 and may provide a second power 482 which is different than the first power 481 to semiconductor die 600b by a via (e.g., TSV) 156. The first power 481 and second power 482 may be different, for example, in terms of voltage, current, frequency, etc. Thus, for example, the first power 481 may include a first voltage (e.g., high voltage) and the second power 482 may include a second voltage (e.g., medium voltage) different (e.g., less than) than the first voltage. The first power 481 may include a first current and the second power 482 may include a second current different (e.g., less than) than the first current, and so on.

Providing power from the HV die 600c by way of TSV 155 and TSV 156 may work to achieve power savings. Generally, an operating voltage of an I/O and core of chips (e.g., operating voltage of the I/O and core of semiconductor die 600a or semiconductor die 600b) may be different. A voltage conversion may be necessary to provide the different operating voltages, and such voltage conversion may typically be performed by an internal transistor of the chips. In the present invention, however, the voltage conversion may be performed by the HV die 600c (e.g., the power management chip) which may be more efficient at voltage conversion than the chips. Indeed, the HV die 600c can be designed and fabricated with design structures for the purpose of providing better conversion efficiency, and may not be limited to other stacked single chip manufacturing processes. Thus, power savings can be achieved by performing voltage conversion in the HV die 600c with high conversion efficiency, and then transmitting the different voltages to a required operating area of the chips by way of the TSV 155 and TSV 156.

Figure 6B:
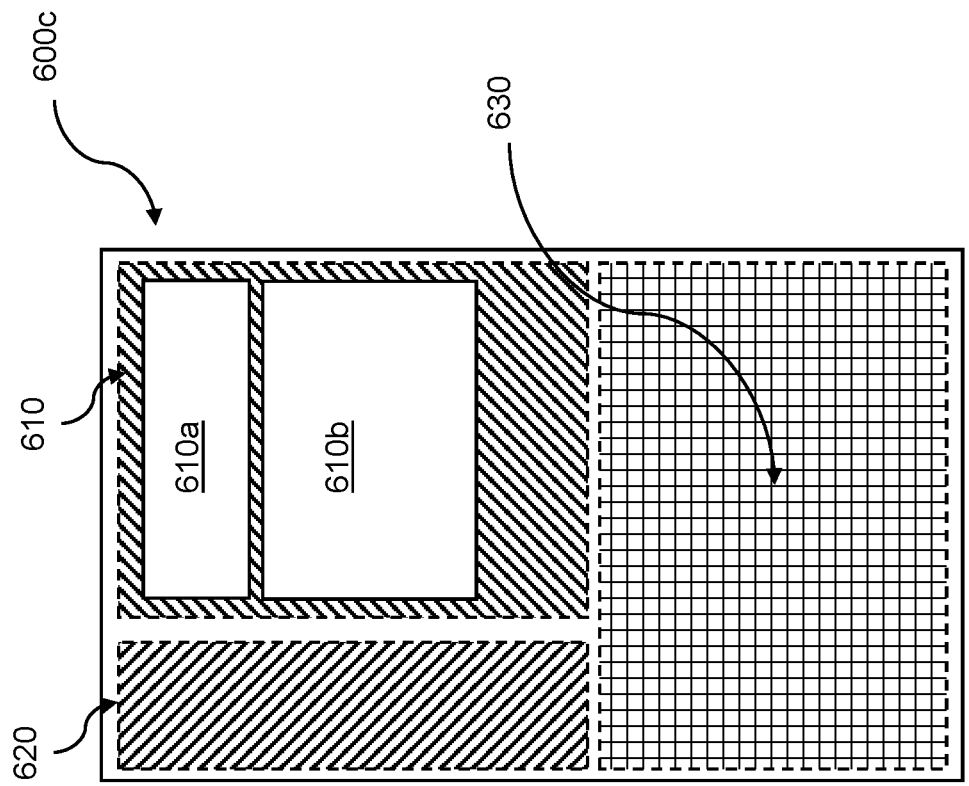
FIG. 6B illustrates a plan view of the HV die 600c (e.g., a layout design of the HV die 600c) according to some embodiments.

FIG. 6B illustrates a plan view of the HV die 600c (e.g., a layout design of the HV die 600c) according to some embodiments. As illustrated in FIG. 6B, the HV die 600c may include a power management function area 610 in which elements for managing power in the stacked semiconductor device 650 are located, a core area 620 in which processing elements are located, and an input/output (I/O) area 630 by which power, data, etc. are input and output to and from the HV die 600c. The HV die 600c (e.g., power management chip) may be designed to have a main function of providing other chips with appropriate current, voltage, and power, and thus, a core of the HV die 600c may occupy a relatively small area. In particular, in the HV die 600c, the core area 620 may have a size that is less than a size of the power management function area 610 and less than a size of the I/O area 630. In some embodiments, one of a size of the power management function area 610 and a size of the I/O area 630 may be more than twice the size of the core area 620.

The power management function area 610 in the HV die 600c may include, for example, a gate driver section 610a which may operate at a high voltage of 25V/32V, and a source driver section 610b which may operate at a medium voltage of 5V/6V/8V. The power management function area 610 outside of the gate driver section 610a and source driver section 610b may include a laterally-diffused metal-oxide semiconductor (LDMOS) section. Further, an operating voltage of the power management function area 610 (e.g., greater than 1.2V) may be greater than an operating voltage (e.g., about 1.1V-1.2V) of the core area 620.

Figure 6C:
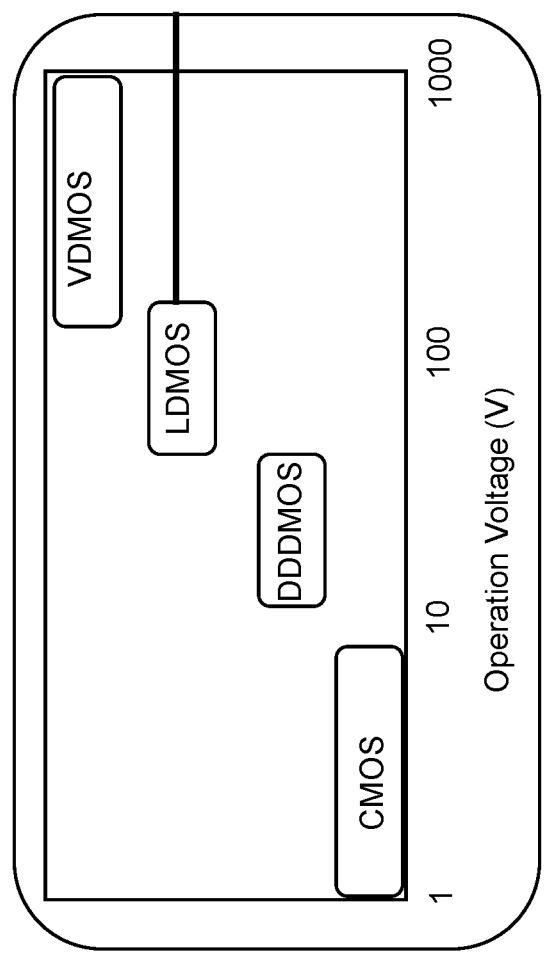
FIG. 6C provides a chart which illustrates the operating voltages of the various MOSFETs that may be utilized in the power management function area 610 of the HV die 600c.

FIG. 6C provides a chart which illustrates the operating voltages of the various MOSFETs that may be utilized in the power management function area 610 of the HV die 600c. As illustrated in FIG. 6C, different MOSFETs may have different operating voltages. For example, the LDMOS in the power management function area 610 may have an operating voltage that is less than vertically diffused metal oxide semiconductor (VDMOS) but greater than an operating voltage of double-diffused drain metal oxide semiconductor (DDDMOS). The operating voltage of the CMOS may require the smallest operating voltage of the various MOSFETs operating in the stack and serviced by the HV die 600c.

Figure 7:
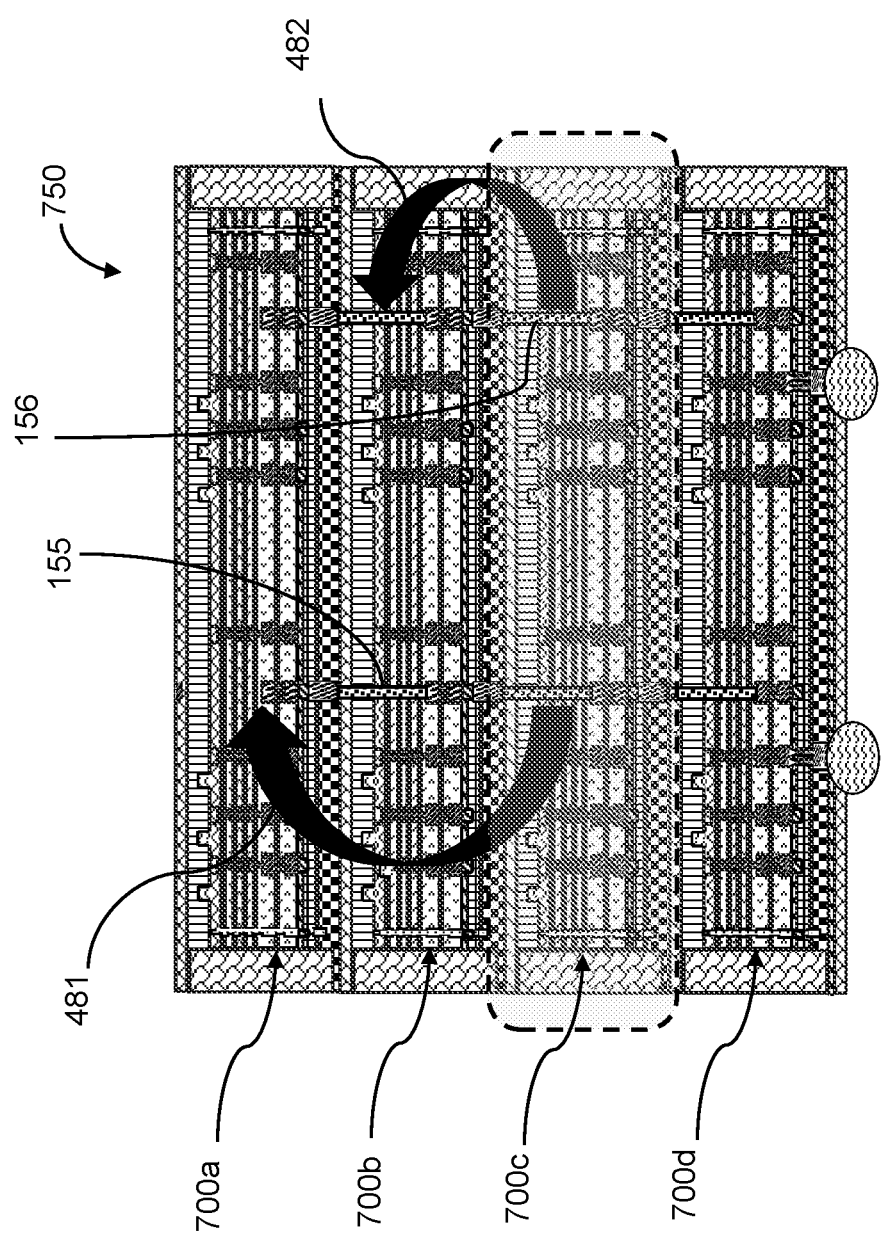
FIG. 7 illustrates a vertical cross-section view of a semiconductor die stack 750 according to one or more embodiments.

FIG. 7 illustrates a semiconductor die stack 750 (e.g., vertical semiconductor die stack) according to one or more embodiments. The semiconductor die stack 750 includes a plurality of semiconductor dies 700a, 700b and 700d, and a SiC-based or GaN-based (SiC/GaN) power management semiconductor die 700c that manages power in the semiconductor die stack 750. The SiC/GaN power management semiconductor die 700c may have a structure and function similar to the PMIC die 500c and HV die 600c which may be silicon-based semiconductor dies. However, the SiC/GaN power management semiconductor die 700c may provide power (e.g., transfer voltage) with a reduced power consumption and therefore, improved power savings as compared to the silicon-based semiconductor dies, because SiC (Silicon Carbide) has a band gap of 2.86 eV and GaN (Gallium nitride) has a band gap of 3.4 eV, whereas Si (Silicon) has a band gap of only 1.2 eV. Thus, both GaN-based devices and SiC-based devices may have higher electron mobility than Si devices, and therefore, may be able to provide power savings in the semiconductor die stack 750.

In particular, the SiC/GaN power management semiconductor die 700c may provide a first power 481 to semiconductor die 700a by a via (e.g., through silicon via (TSV)) 155 and may provide a second power 482 which is different than the first power 481 to semiconductor die 700b by a via (e.g., TSV) 156. The first power 481 and second power 482 may be different, for example, in terms of voltage, current, frequency, etc. Thus, for example, the first power 481 may include a first voltage (e.g., high voltage) and the second power 482 may include a second voltage (e.g., medium voltage) different (e.g., less than) than the first voltage. The first power 481 may include a first current and the second power 482 may include a second current different (e.g., less than) than the first current, and so on.

Providing power from the SiC/GaN power management semiconductor die 700c by way of TSV 155 and TSV 156 may work to achieve power savings in the semiconductor die stack 750. Generally, an operating voltage of an I/O and core of chips (e.g., operating voltage of the I/O and core of semiconductor die 700a or semiconductor die 700b) may be different. A voltage conversion may be necessary to provide the different operating voltages, and such voltage conversion may typically be performed by an internal transistor of the chips. In the present invention, however, the voltage conversion may be performed by the SiC/GaN power management semiconductor die 700c (e.g., the power management chip) which may be more efficient at voltage conversion than the chips. Indeed, the SiC/GaN power management semiconductor die 700c can be designed and fabricated with design structures for the purpose of providing better conversion efficiency, and may not be limited to other stacked single chip manufacturing processes. Thus, power savings can be achieved by performing voltage conversion in the SiC/GaN power management semiconductor die 700c with high conversion efficiency, and then transmitting the different voltages to a required operating area of the chips by way of the TSV 155 and TSV 156.

Figure 8:
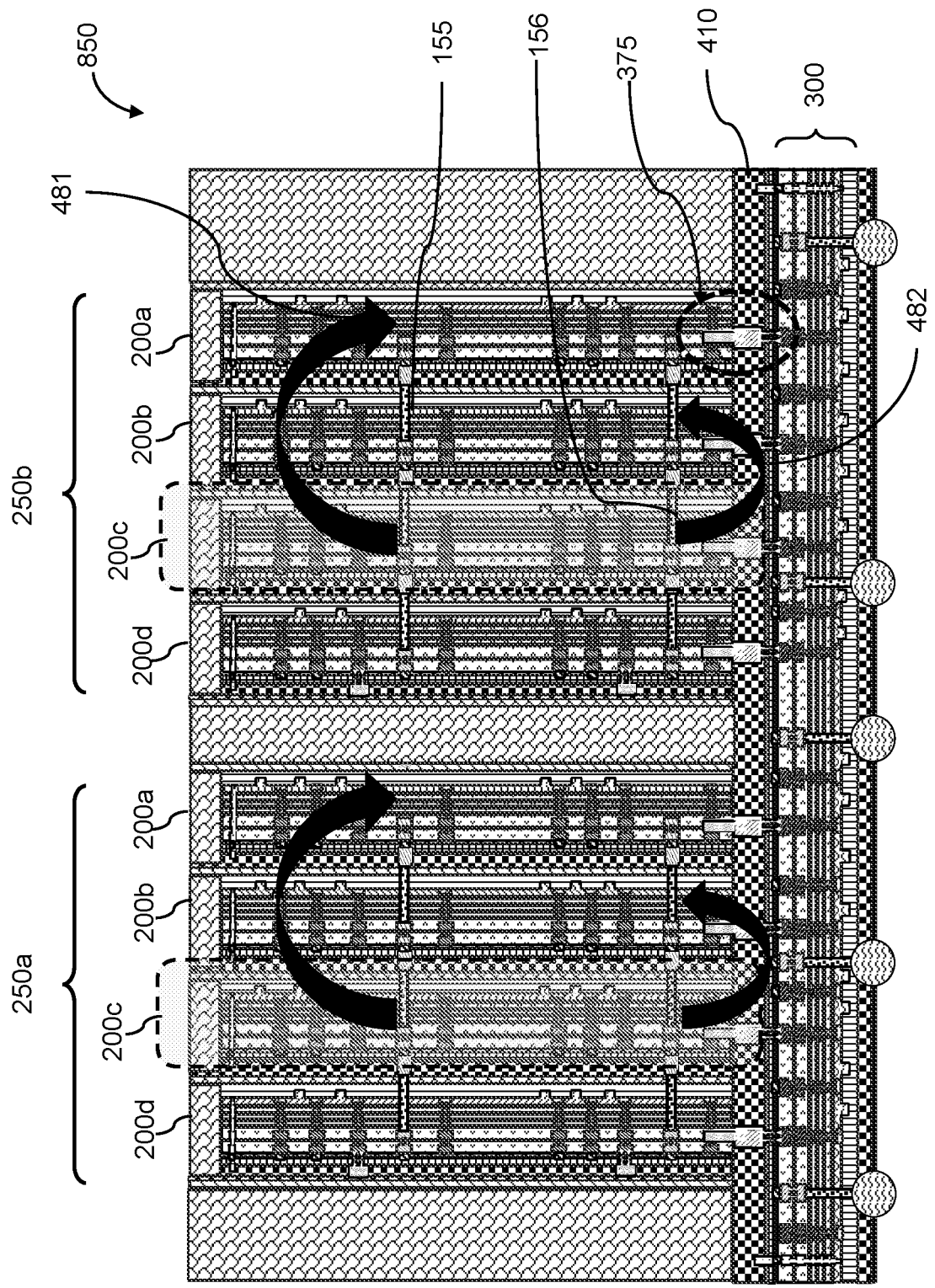
FIG. 8 illustrates a vertical cross-section view of a semiconductor die stack 850 (e.g., SoIC device) according to one or more embodiments.

FIG. 8 illustrates a semiconductor die stack 850 (e.g., SoIC device) according to one or more embodiments. The semiconductor die stack 850 has a structure similar to that described above with respect to semiconductor die stack 350.

The semiconductor die stack 850 includes a plurality of semiconductor die stacks 250a, 250b that each include a plurality of semiconductor dies 200a-200d. Each of the semiconductor die stacks 250a, 250b may be connected to the base semiconductor die 300 by one or more junction circuits 375. In particular, each of the semiconductor dies 200a-200d of the semiconductor die stacks 250a, 250b may be connected to the base semiconductor die 300 by a dedicated junction circuit 375, as illustrated in FIG. 8.

The semiconductor die 200c in each of the semiconductor die stacks 250a, 250b may be a power management semiconductor die such as the PMIC die 500c or HV die 600c. The power management semiconductor die (e.g., semiconductor die 200c) may provide a first power 481 to semiconductor die 200a by a via (e.g., through silicon via (TSV)) 155 and may provide a second power 482 which is different than the first power 481 to semiconductor die 200b by a via (e.g., TSV) 156. The first power 481 and second power 482 may be different, for example, in terms of voltage, current, frequency, etc. Thus, for example, the first power 481 may include a first voltage (e.g., high voltage) and the second power 482 may include a second voltage (e.g., low voltage) different (e.g., less than) than the first voltage. The first power 481 may include a first current and the second power 482 may include a second current different (e.g., less than) than the first current, and so on.

Providing power from the semiconductor die 200c by way of TSV 155 and TSV 156 may work to achieve power savings in the semiconductor die stack 850. Generally, an operating voltage of an I/O and core of chips (e.g., operating voltage of the I/O and core of semiconductor die 200a or semiconductor die 200b) may be different. A voltage conversion may be necessary to provide the different operating voltages, and such voltage conversion may typically be performed by an internal transistor of the chips. In the present invention, however, the voltage conversion may be performed by the semiconductor die 200c (e.g., the power management chip) which may be more efficient at voltage conversion than the chips. Indeed, the semiconductor die 200c can be designed and fabricated with design structures for the purpose of providing better conversion efficiency, and may not be limited to other stacked single chip manufacturing processes. Thus, power savings can be achieved by performing voltage conversion in the semiconductor die 200c with high conversion efficiency, and then transmitting the different voltages to a required operating area of the chips by way of the TSV 155 and TSV 156.

Figure 9:
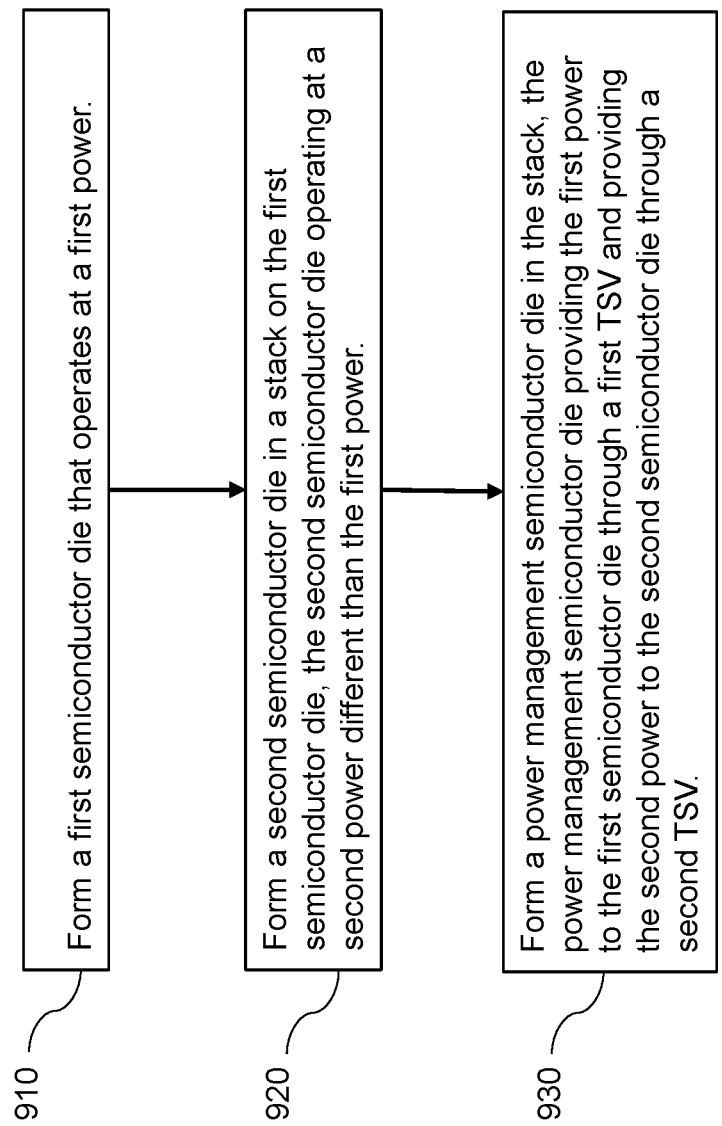
FIG. 9 is a flow chart of a method of forming a semiconductor device 550, 650, 750, 850 according to some embodiments.

FIG. 9 illustrates a method of forming a semiconductor device 550, 650, 750, 850 according to some embodiments. The method includes Step 910 of forming a first semiconductor die 200a, 500a, 600a, 700a that operates at a first power 481, Step 920 of forming a second semiconductor die 200b, 500b, 600b, 700b in a stack on the first semiconductor die 200a, 500a, 600a, 700a, the second semiconductor die 200b, 500b, 600b, 700b operating at a second power 482 different than the first power 481, and Step 930 of forming a power management semiconductor die 200c, 500c, 600c, 700c in the stack, the power management semiconductor die 200c, 500c, 600c, 700c providing the first power 481 to the first semiconductor die 200a, 500a, 600a, 700a through a first via 155 and providing the second power 482 to the second semiconductor die 200b, 500b, 600b, 700b through a second via 156.

Figure 10:
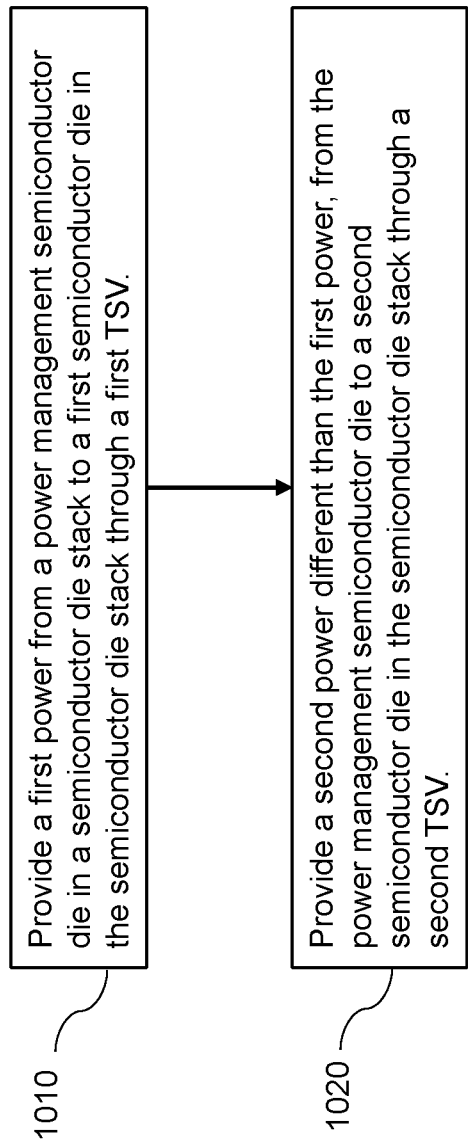
FIG. 10 is a flow chart of a method of supplying power in a semiconductor device 550, 650, 750, 850, according to some embodiments.

FIG. 10 illustrates a method of supplying power in a semiconductor device 550, 650, 750, 850, according to some embodiments. The method includes Step 1010 of providing a first power 481 from a power management semiconductor die 200c, 500c, 600c, 700c in a semiconductor die stack to a first semiconductor die 200a, 500a, 600a, 700a in the semiconductor die stack through a first via 155, and Step 1020 of providing a second power 482 different than the first power 481, from the power management semiconductor die 200c, 500c, 600c, 700c to a second semiconductor die 200b, 500b, 600b, 700b in the semiconductor die stack through a second via 156.

Referring to FIGS. 1-10, in some embodiments, a semiconductor device 550, 650, 750, 850 may include a first semiconductor die 200a, 500a, 600a, 700a that operates at a first power 481; a second semiconductor die 200b, 500b, 600b, 700b in a stack on the first semiconductor die 200a, 500a, 600a, 700a that operates at a second power 482 different than the first power 481; and a power management semiconductor die 200c, 500c, 600c, 700c in the stack that provides the first power 481 to the first semiconductor die 200a, 500a, 600a, 700a through a first via 155 and provides the second power 482 to the second semiconductor die 200b, 500b, 600b, 700b through a second via 156.

In one embodiment, the semiconductor device 550, 650, 750, 850 may include a system on integrated chips (SoIC) device and the power management semiconductor die 200c, 500c, 600c, 700c may manage power in the SoIC device. The first via 155 may include a through silicon via (TSV) connecting the power management semiconductor die 200c, 500c, 600c, 700c to the first semiconductor die 200a, 500a, 600a, 700a, and the second via 156 may include a through silicon via (TSV) connecting the power management semiconductor die 200c, 500c, 600c, 700c to the second semiconductor die 200b, 500b, 600b, 700b.

In one embodiment, the power management semiconductor die 200c, 500c, 600c, 700c may include a power management function area 510, 610; and a core area 520, 620 having a size that is less than a size of the power management function area 510, 610. In one embodiment, the power management function area 510 may include a BCD area including a bipolar section 510a, a CMOS section 510b and a DMOS 510c section. In one embodiment, the power management function area 610 may include a high voltage (HV) area including a gate driver section 610a, source driver section 610b and an LDMOS section. In one embodiment, the power management semiconductor die 200c, 500c, 600c, 700c may include an input/output (I/O) area 630, and a core area 520, 620 having a size that is less than a size of the I/O area 630. In one embodiment, the power management semiconductor die 200c, 500c, 600c, 700c may include one of a GaN-based device and a SiC-based device. In one embodiment, the first power 481 may include a first voltage and the second power 482 may include a second voltage different than the first voltage. In one embodiment, the first power 481 may include a first current and the second power 482 may include a second current different than the first current.

In another aspect, with reference to FIGS. 1-10, a semiconductor device 850 may be provided that includes a plurality of the semiconductor devices 550, 650, 750, wherein each of the plurality of semiconductor devices 550, 650, 750 may include the first semiconductor die 200a, 500a, 600a, 700a, second semiconductor die 200b, 500b, 600b, 700b and power management semiconductor die 200c, 500c, 600c, 700c. The semiconductor device 850 may also include a base semiconductor die 300, the plurality of semiconductor devices 550, 650, 750 being mounted on the base semiconductor die 300 such that a side face of the plurality of semiconductor devices 550, 650, 750 is bonded to an upper surface of the base semiconductor die 300, and a junction circuit 375 for electrically connecting the base semiconductor die 300 to the plurality of semiconductor devices 550, 650, 750.

In another aspect, with reference to FIGS. 1-10, a method of forming a semiconductor device 550, 650, 750, 850 may be provided, wherein the method may include forming a first semiconductor die 200a, 500a, 600a, 700a that operates at a first power 481, forming a second semiconductor die 200b, 500b, 600b, 700b in a stack on the first semiconductor die 200a, 500a, 600a, 700a, the second semiconductor die 200b, 500b, 600b, 700b operating at a second 482 power different than the first power 481, and forming a power management semiconductor die 200c, 500c, 600c, 700c in the stack, the power management semiconductor die 200c, 500c, 600c, 700c providing the first power 481 to the first semiconductor die 200a, 500a, 600a, 700a, through a first via 155 and providing the second power 482 to the second semiconductor die 200b, 500b, 600b, 700b through a second via 156.

In another aspect, with reference to FIGS. 1-10, a method of supplying power in a semiconductor device 550, 650, 750, 850 may be provided, wherein the method may include providing a first power 481 from a power management semiconductor die 200c, 500c, 600c, 700c in the semiconductor die stack to a first semiconductor die 200a, 500a, 600a, 700a in the semiconductor die stack through a first via 155, and providing a second power 482 different than the first power 481, from the power management semiconductor die 200c, 500c, 600c, 700c to a second semiconductor die 200b, 500b, 600b, 700b in the semiconductor die stack through a second via 156.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first semiconductor die that operates at a first power;
a second semiconductor die in a stack on the first semiconductor die that operates at a second power different than the first power; and
a power management semiconductor die in the stack that provides the first power to the first semiconductor die through a first via and provides the second power to the second semiconductor die through a second via, wherein the power management semiconductor die comprises:
   a BCD area including a bipolar section, a CMOS section and a DMOS section; and
   a core area including a plurality of processing elements adjacent the BCD area and having a size less than a size of the BCD area.

2. The semiconductor device of claim 1, wherein the semiconductor device comprises a system on integrated chips (SoIC) device and the power management semiconductor die manages power in the SoIC device, and
wherein the first via comprises a through silicon via (TSV) connecting the power management semiconductor die to the first semiconductor die, and the second via comprises a through silicon via (TSV) connecting the power management semiconductor die to the second semiconductor die.

3. The semiconductor device of claim 1, wherein the power management semiconductor die comprises:
a power management function area comprising the BCD area.

4. The semiconductor device of claim 3, wherein the power management function area comprises a high voltage (HV) area including a gate driver section, source driver section and an LDMOS section.

5. The semiconductor device of claim 1, wherein the power management semiconductor die further comprises:
an input/output (I/O) area, wherein the core area has a size that is less than a size of the I/O area.

6. The semiconductor device of claim 1, wherein the power management semiconductor die comprises one of a GaN-based device and a SiC-based device.

7. The semiconductor device of claim 1, wherein the first power comprises a first voltage and the second power comprises a second voltage different than the first voltage.

8. The semiconductor device of claim 1, wherein the first power comprises a first current and the second power comprises a second current different than the first current.

9. A semiconductor die stack, comprising:
a first semiconductor die that operates at a first power;
a second semiconductor die that operates at a second power different than the first power; and
a third semiconductor die on a side of the second semiconductor die opposite the first semiconductor die and configurated to provide the first power to the first semiconductor die through a first via and provide the second power to the second semiconductor die through a second via, wherein the third semiconductor die comprises:
   a BCD area including a bipolar section, a CMOS section and a DMOS section; and
   a core area including a plurality of processing elements adjacent the BCD area and having a size less than a size of the BCD area.

10. The semiconductor die stack of claim 9, wherein the second semiconductor die is located between the first semiconductor die and the third semiconductor die.

11. The semiconductor die stack of claim 10, wherein the first via is located in the second semiconductor die and the second via is located in the third semiconductor die.

12. The semiconductor die stack of claim 10, further comprising:
a fourth semiconductor die on a side of the third semiconductor die opposite the second semiconductor die, wherein the third semiconductor die is configured to provide power to the fourth semiconductor die.

13. The semiconductor die stack of claim 9, wherein the third semiconductor die comprises a power management integrated circuit (PMIC) die configured to manage power in the first semiconductor die and the second semiconductor die.

14. The semiconductor die stack of claim 10, wherein a function of the PMIC die comprises at least one of AC to DC conversion, battery management, power-source selection, voltage regulation, dynamic voltage scaling, dynamic frequency scaling and/or power sequencing.

15. The semiconductor die stack of claim 9, wherein the third semiconductor die comprises:
a power management function area comprising the BCD area.

16. The semiconductor die stack of claim 9, wherein the third semiconductor die comprises:
an input/output (I/O) area, wherein the core area has a size that is less than a size of the I/O area.

17. A semiconductor die stack, comprising:
an upper semiconductor die;
a lower semiconductor die located under the upper semiconductor die; and
a power management die between the upper semiconductor die and the lower semiconductor die and configurated to manage power in the upper semiconductor die and the lower semiconductor die, wherein the power management semiconductor die comprises:
   a BCD area including a bipolar section, a CMOS section and a DMOS section; and
   a core area including a plurality of processing elements adjacent the BCD area and having a size less than a size of the BCD area.

18. The semiconductor die stack of claim 17, wherein the upper semiconductor die includes an upper via, the lower semiconductor die includes a lower via, and the power management die includes a via connecting the upper via to the lower via.

19. The semiconductor device of claim 1, wherein an operating voltage of the BCD area is greater than an operating voltage of the core area.

20. The semiconductor device of claim 3, wherein a size of the power management function area is more than twice the size of the core area.

* * * * *